(12) United States Patent
Komura et al.

(10) Patent No.: US 7,245,549 B2
(45) Date of Patent: Jul. 17, 2007

(54) SEMICONDUCTOR MEMORY DEVICE AND METHOD OF CONTROLLING THE SEMICONDUCTOR MEMORY DEVICE

(75) Inventors: Kazufumi Komura, Kasugai (JP); Yoshiharu Kato, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 8 days.

(21) Appl. No.: 11/058,302

(22) Filed: Feb. 16, 2005

(65) Prior Publication Data

US 2005/0157574 A1 Jul. 21, 2005

Related U.S. Application Data

(63) Continuation of application No. PCT/JP03/03128, filed on Mar. 14, 2003.

(51) Int. Cl.
*G11C 8/00* (2006.01)

(52) U.S. Cl. .................. 365/230.03; 365/203; 365/207

(58) Field of Classification Search .......... 365/230.03, 365/203, 207
See application file for complete search history.

(56) References Cited

U.S. PATENT DOCUMENTS

| | | | |
|---|---|---|---|
| 6,205,068 B1 * | 3/2001 | Yoon | 365/203 |
| 6,430,091 B2 * | 8/2002 | Tanizaki | 365/189.11 |
| 6,816,416 B2 * | 11/2004 | Won | 365/189.02 |

FOREIGN PATENT DOCUMENTS

| | | |
|---|---|---|
| JP | 5-159575 | 6/1993 |
| JP | 7-130175 | 5/1995 |
| JP | 7-302495 | 11/1995 |
| JP | 8-153391 | 6/1996 |
| JP | 8-212783 | 8/1996 |
| JP | 9-35474 | 2/1997 |
| JP | 9-45879 | 2/1997 |
| JP | 9-320266 | 2/1997 |
| JP | 09-063266 | 3/1997 |
| JP | 9-63266 | 3/1997 |
| JP | 9-161477 | 6/1997 |
| JP | 10-222977 | 8/1998 |
| JP | 11-134854 | 5/1999 |
| JP | 2000-100171 | 4/2000 |
| JP | 2000-100171 | 7/2000 |
| JP | 2000-195258 | 7/2000 |
| JP | 2000-298984 | 10/2000 |

* cited by examiner

*Primary Examiner*—David Lam
(74) *Attorney, Agent, or Firm*—Arent Fox LLP

(57) ABSTRACT

A semiconductor memory device is provided that can conduct the equalizing operation of bit lines with a low current consumption while maintaining a normal accessing speed and the chip area, and a control method thereof. In a semiconductor memory device of the shared sense amplification system, in a predetermined number of times which is (k−1) times or less among k-times of continuous word line selections of a selected memory block, the bit line separation gate of the unselected memory block is rendered conductive in the active period of the equalizing unit after the word line selection. Also, a circuit that equalizes a wiring higher in the capacity component is driven by a higher voltage level according to the wiring capacity component of the sense amplification power supply line and the bit lines.

25 Claims, 14 Drawing Sheets

SEMICONDUCTOR MEMORY DEVICE AND METHOD OF CONTROLLING THE SEMICONDUCTOR MEMORY DEVICE

CROSS-REFERENCE TO RELATED APPLICATIONS

This application is a continuation application based upon and claims the benefit of the prior PCT International Patent Application No. PCT/JP03/03128 filed on Mar. 14, 2003, the entire contents of which are incorporated herein by reference.

BACKGROUND OF THE INVENTION

1. Field of the Invention

The present invention relates to a semiconductor memory device and a control method thereof, and more particularly to a semiconductor memory device that improves the equalizing operation of bit lines and a control method thereof.

2. Description of Related Art

In a semiconductor memory device such as a dynamic random access memory (hereinafter referred to as "DRAM"), there is a shared sense amplifier system that shares one sense amplifier group by two memory blocks. In this case, in order to separate a bit line within an unselected memory block from a sense amplifier, a bit line separation gate (BT) is disposed.

FIG. 10 is a diagram showing a part of a shared sense amplifier system. A sense amplifier S/A is connected between a bit line BLZ and a complementary bit line BLX, and shared by memory blocks BLK1 and BLK2 adjacent to each other. Separation gates BTL and BTR are connected between the respectively corresponding memory blocks BLK1, BLK2 and the sense amplifier S/A, and perform conduction and non-conduction in response to the corresponding separation gate control signals sbltlx and sbltrx. The bit lines are equalized by an equalizer circuit 150 disposed at the sense amplifier.

In this example, an alternate sense amplifier S/As may be replaced by the sense amplifier S/A. In the above-mentioned sense amplifier S/A, an inner step-down voltage Vcc is applied to a sense amplifier active line PSA, and a ground voltage Vss is applied to a sense amplifier active line NSA, to thereby bring the sense amplifier S/A into an active state. On the other hand, in the alternate sense amplifier S/As, when an alternate sense amplifier active signal LEX of a low level is inputted to a transistor Tr9, and an alternate sense amplifier active signal LEZ of a high level is inputted to a transistor Tr10, Vcc and Vss are then applied to the alternate sense amplifier S/As, to thereby bring the alternate sense amplifier S/A into an active state.

FIG. 11 is a timing chart showing self refresh operation. The self refresh operation is conducted in response to a "high" level (active) of a self-refresh enable signal SREFE. In a period of time when the block BLK1 is self-refreshed, the control signal sbltlx is kept in the "high" level, the separation gate BTL is rendered conductive, and the bit lines BLLZ and BLLX within the block BLK1 continue to be connected to the bit lines BLZ and BLX that are connected with the sense amplifier S/A. During the period of time, word lines sw10, sw11, . . . are sequentially activated in response to the "low" level transition of /RAS that is an internal RAS signal, and the bit lines BLLZ and BLLX are restored. Simultaneously, the word lines sw10, sw11, . . . are inactivated in response to the "high" level transition of /RAS, and the bit lines BLLZ and BLLX are equalized.

Also, the separation gate BTR on the unselected block BLK 2 side is rendered conductive by putting the control signal sbltrx into the "high" level every period where /RAS is "high" level, that is, every period where the bit line of the BLK1 is equalized. As a result, the bit lines BLRZ and BLRX of the unselected block BLK2 are connected to the bit lines BLZ and BLX and equalized. Meanwhile, when the block BLK2 is self-refreshed, the same equalization control is conducted on the block BLK1. Subsequently, the same operation is conducted on the respective blocks, to thereby complete self refresh with respect to all of the memory cells.

On the other hand, as disclosed in JP 9-161477A and JP 10-222977A, in the control shown in FIG. 12, the control signal of the separation gate on the unselected block side is always kept in the "low" level in a refresh period of the memory cell on the selected block side. For that reason, the sense amplifier S/A and the bit line on the unselected block side are not connected to each other even during the equalizing period of the selected block. Unlike with the case shown in FIG. 11 where the unselected block is connected, the separation gate that is connected to the unselected block does not conduct switching operation every time the selected block is equalized, thereby reducing charge and discharge current.

In a semiconductor memory device disclosed by JP 8-153391A and JP 9-45879A, a bit line equalizer circuit is disposed in each of memory blocks separated from the sense amplifier with the bit line separation gate. Accordingly, the equalizing operation is conducted by means of the bit line equalizer circuit disposed in the unselected memory block even in a period where a bit line between the unselected memory block and the sense amplifier is rendered nonconductive. As a result, the potential displacement caused by the floating state of the bit line potential can be prevented.

Also, in FIG. 10, both of a bit line equalization control signal BRS, and an equalization control signal BRSS of sense amplifier active lines PSA/NSA are controlled between a step-up voltage Vpp and the ground voltage Vss. The driving performance of an equalization transistor is enhanced by driving with the step-up voltage Vpp that has been stepped up from an external supply voltage Vdd, thereby reduce an equalization period of time.

Also, in the recent semiconductor memory device, in order to increase the speed of the restoring operation or improve the sensitivity to accumulated charges by using the sense amplifier, a bit line length may be shortened. With this structure, the wiring capacity of the bit line is reduced, and a reduction in the current consumption at the time of restoring and a reduction in the equalization period of time are tried.

SUMMARY OF THE INVENTION

There arise a first problem associated with the control of the bit line separation gate of the unselected block, and a second problem associated with the equalizing control.

The problem associated with the control of the bit line separation gate will be described. In FIGS. 10 and 11, in the case where the memory block BLK1 is set as a selected block of the self refresh operation, the control signal sbltrx of the separation gate BTR on the unselected block BLK2 side becomes high level every period of the equalizing operation in which /RAS becomes high level. Therefore, because the switching operation of the separation gate BTR is repeated every equalization period, there arises such a problem that the charge and discharge current increases.

Also, in the semiconductor memory device in which the bit line equalizer circuit is disposed in each of the memory blocks that are separated from the sense amplifier with the bit line separation gate, even if the separation gate of the unselected block is kept in a nonconductive state as shown in FIG. 12, there is no case in which the bit line potential of the unselected block becomes in the floating state, and the potential is displaced. However, in the circuit structure where the bit line equalizer circuit is disposed in each of the memory blocks, the number of structural elements increases as compared with the circuit structure where the equalizer circuit is disposed in the sense amplifier as in an equalizer circuit 150 shown in FIG. 10. In the semiconductor memory device having a number of bit lines, an increase in the number of structural elements of the bit line equalizer circuit leads to an increase in an area occupied by a chip with a problem.

Subsequently, the problem associated with the equalization control will be described. In the circuit shown in FIG. 10, in order to reduce the current consumption due to the drive amplitudes of the bit line equalization control signal BRS and the equalization control signal BRSS of the sense amplifier active line PSA/NSA, and to reduce the current consumption in a step-up circuit (not shown) which develops the step-up voltage Vpp, there is proposed that the drive amplitude between the step-up voltage Vpp and the ground voltage Vss changes to the drive amplitude between the step-down voltage Vcc and the ground voltage Vss. However, in this case, as shown in FIG. 13, the driving performance of the equalization transistor is short, and there is a fear that an equalization termination time between the sense amplification active lines PSA and NSA and between the bit lines BLZ and BLX is lengthened from T1 to T2. As a result, there arises such a problem that the equalizing operation is not completed within a cycle time frame, and data is destroyed. Also, in order to prevent data from being destroyed, it is necessary to ease the specification of the cycle time according to the lowering of the equalization speed. However, there arises such a problem that the accessing speed is lowered.

Under the above circumstances, there is proposed a case in which the bit line length is shortened to reduce the wiring capacity and increase the equalization speed. In this case, because the wiring capacities of the sense amplification active lines PSA and NSA are constant, as shown in FIG. 14, there is a fear that time lags in the equalizing operation occur between the sense amplification active lines PSA and NSA and between the bit lines BLZ and BLX, and an abnormal current of short-circuiting occurs through the transistor of the sense amplifier. This is because there is a period during which the voltage level of the bit lines BLZ and BLX which is a gate terminal voltage exceeds a threshold voltage as compared with the voltage level of the sense amplification activation lines PSA and NSA which is a source terminal voltage of the sense amplification transistor. As a result, the current consumption is not reduced which is a problem.

Also, in FIG. 10, a problem occurring when the sense amplifier S/A is replaced by the alternate sense amplifier S/As will be described. In the case where the memory block BLK1 is set as the selected block, a time lag may occur between the equalization termination time of the bit lines BLLZ and BLLX within the memory block BLK1 and the equalization termination time of the bit lines BLLZ and BLLX that are connected with the sense amplifier.

The bit lines BLLZ and BLLX are equalized through the separation gate BLT. Also, in the separation gate BTL, the transistor size may be limited because a demand is made to integrate the device, and a time may be taken for equalization through the separation gate. Then, because the specification of the cycle time is determined according to the latest equalization time, it is difficult to exhibit the natural performance of the semiconductor memory device when the equalization time lag exists.

The present invention has been made to eliminate at least one of the above problems with the conventional art, and therefore an object of the present invention is to provide a semiconductor memory device that can conduct the equalizing operation of the bit lines with a low current consumption and a control method thereof while maintaining the normal accessing speed and chip area, and a control method thereof.

In order to achieve the above object, according to one aspect, there is provided a semiconductor memory device having first and second memory blocks from which stored information is read in bit lines according to a selected word line, and a sense amplifier shared by each of first and second bit lines within the first and second memory blocks, comprising: a first separation gate that controls the connection and separation of the first bit line and the sense amplifier; and an equalizing unit that equalizes the second bit line.

In the semiconductor memory device according to the one aspect, when the second memory block is accessed, the first separation gate connects the first bit line and the sense amplifier in an active period of the equalizing unit after the word line is selected in a predetermined number of times which is (k−1) times or less among k times of continuous word line selections when the second memory block is accessed.

Also, according to another aspect, there is provided a method of controlling a semiconductor memory device, comprising: a selected block accessing step of continuously repeating restoring operation subsequent to a word line selection and subsequent equalizing operation when a second memory block is accessed; and an unselected block equalizing step of connecting a first bit line and a sense amplifier in the equalizing operation of a predetermined number of times which is (k−1) times or less among k times of the selected block accessing step.

As a result, the number of times of switching of the first separation gate of the unselected block is reduced, thereby making it possible to reduce a charge and discharge current due to the switching operation.

According to another aspect, there is provided a semiconductor memory device having a sense amplification activating unit that applies a supply voltage to two power supply lines that are commonly connected to a plurality of sense amplifiers provided for each of the bit lines when stored information read to the bit lines is amplified by the plurality of sense amplifiers, comprising: a first equalizing unit that equalizes the power supply lines by activation through a first voltage; and a second equalizing unit that equalizes the bit lines by activation through a second voltage.

According to another aspect, there is provided a method of controlling a semiconductor memory device in which a supply voltage is applied to two power supply lines that are commonly connected to a plurality of sense amplifiers provided for each of the bit lines when stored information read to the bit lines is amplified by the plurality of sense amplifiers.

With the above operation, because equalization is made by the first and second voltages according to the respective wiring capacity components, no equalizing time lag occurs. This makes it possible to solve a problem that there is a fear that an abnormal current of short-circuiting flows through the transistor of the sense amplifier, and to reduce the current consumption. Also, according to the present invention, it is possible to decrease any one of the first voltage and the second voltage as compared with a case in which voltage values of the first voltage and the second voltage are identical with each other, and it is possible to suppress the current consumption as compared with a case in which control is made by a high voltage.

According to another aspect, there is provided a semiconductor memory device having a sense amplification activating unit that amplifies the stored information read to the bit lines by a plurality of sense amplifiers disposed in each of the bit lines and controls the application of the supply voltage in each of the sense amplifications.

Then, in the semiconductor memory device, there are provided a separation gate that separates the bit lines into an inner bit line portion that is connected to the sense amplifiers and an outer bit liner portion from which the stored information is read; an inner equalizing unit that equalizes the inner bit line portion while activating the inner bit line portion by a first voltage; and an outer equalizing unit that equalizes the outer bit line portion while activating the outer bit line portion by a second voltage.

Also, according to another aspect, there is provided a method of controlling a semiconductor memory device having an amplifying step of propagating stored information that is read to the outer bit line portion to the sense amplifiers through the inner bit line portion and amplifying the stored information after the outer bit line portion and the inner bit line portion are connected to each other.

With the above operation, since the inner and outer bit line portions are equalized with the equal time, a problem that there is a fear that the natural operation performance cannot be realized by rate-controlling to the longer equalizing time can be solved. Also, according to the present invention, it is possible to decrease any one of the first voltage and the second voltage as compared with a case in which voltage values of the first voltage and the second voltage are identical with each other, and it is possible to suppress the current consumption as compared with a case in which control is made by a high voltage.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

DETAILED DESCRIPTION OF THE PREFERRED EMBODIMENTS

Hereinafter, a description will be given in more detail of a semiconductor memory device and a control method thereof according to specific embodiments of the present invention with reference to FIGS. 1 to 9.

Figure 1:
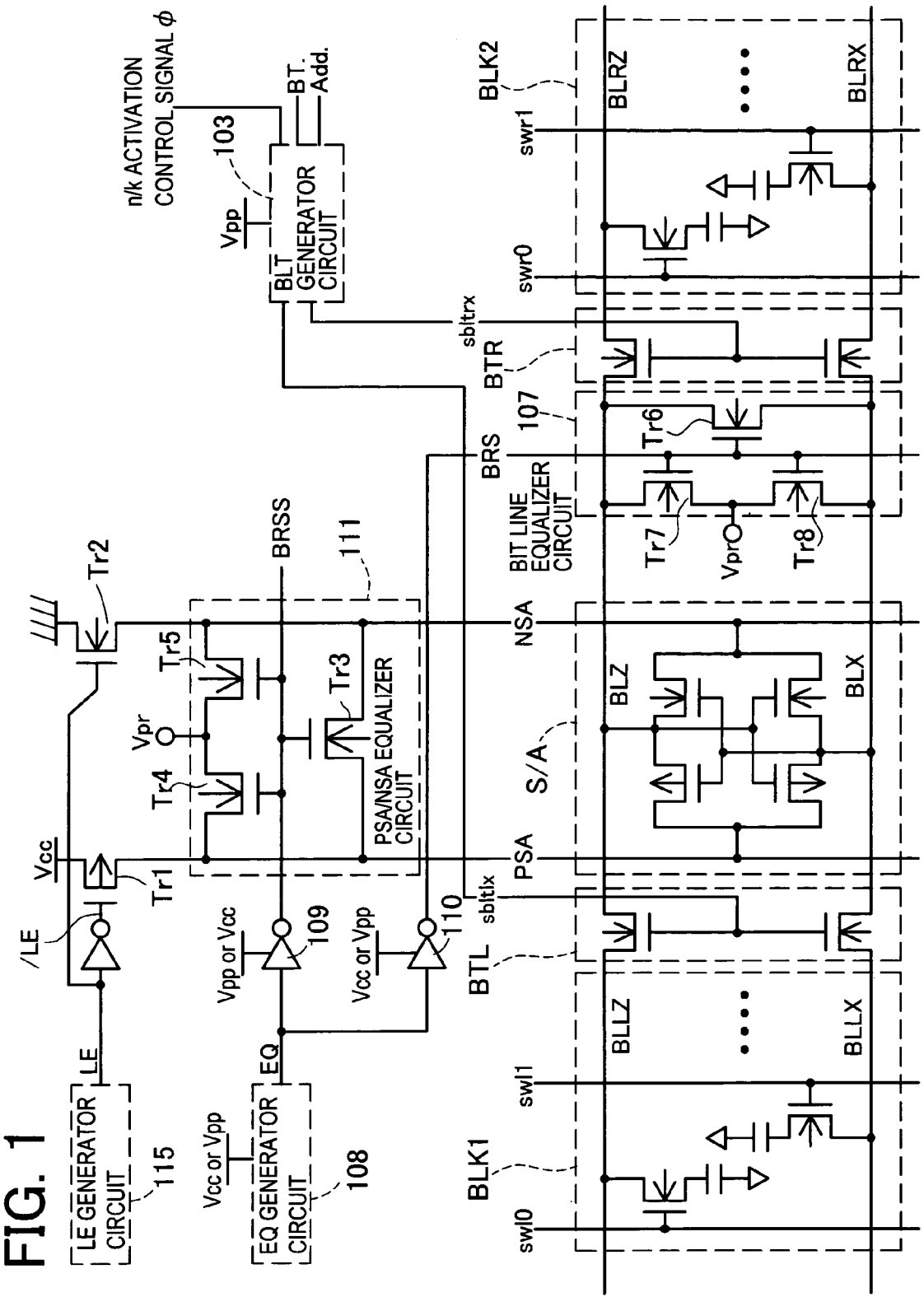
FIG. 1 is a diagram showing a part of a shared sense amplifier system in a semiconductor memory device according to a first embodiment.

FIG. 1 is a diagram showing a part of a shared sense amplifier system in a semiconductor memory device according to a first embodiment. The first embodiment pertains to the control of a separation gate in an unselected memory block, and the equalization control of bit lines.

First, a method of controlling a bit line separation gate will be described. In a shared sense amplifier system, there is disposed a bit line separation gate in order to separate bit lines within an unselected memory block from bit lines connected with a sense amplifier. A separation gate BTL connects bit lines BLLZ and BLLX in the memory block BLK1 and bit lines BLZ and BLX that are connected to a sense amplifier S/A, respectively. Likewise, a separation gate BTR connects bit lines BLRZ and BLRX and the bit lines BLZ and BLX, respectively. In this example, the bit lines BLZ and BLX interposed between the bit line separation gates BTL and BTR may be called "inner bit line portion", and the bit lines BLLZ, BLLX and BLRZ, BLRX may be called "outer bit line portion".

A BLT generator circuit 103 inputs an address Add that identifies the memory blocks, a signal BT that controls the bit line separation gates, and an n/k active control signal $\phi$, and outputs bit line separation gate control signals sbltlx and sbltrx. The separation gates BTL and BTR are made up of NMOS transistors, which are rendered conductive when the bit line separation gate control signals sbltlx and sbltrx of high level are inputted to the separation gates, and rendered nonconductive when the bit line separation gate control signals sbltlx and sbltrx of low level are inputted to the separation gates.

In a stage before the memory cell is accessed, it is necessary to short-circuit between the bit lines BLX and BLZ, between the bit lines BLLZ and BLLX and between the bit lines BLRZ and BLRX to initialize the voltages between those bit lines to an equalization voltage Vpr. This is called "equalizing operation of the bit lines". Likewise, it is necessary to initialize a voltage between the sense amplification active lines PSA and NSA to the equalization voltage Vpr. This is called "equalizing operation of the sense amplification active lines PSA and NSA".

The bit lines BLX and BLZ are separated from the memory blocks BLK1 and BLK2 with the bit line separation gates. The bit lines BLZ and BLX are provided with a bit line equalizer circuit 107 which is made up of NMOS transistors Tr6 to Tr8. The bit lines BLZ and BLX are connected to each other through the transistor Tr6, and the equalization voltage Vpr is connected to the bit lines BLZ and BLX through the transistors Tr7 and Tr8. The bit line equalization control signal BRS is inputted to the gates of the transistors Tr6 to Tr8.

In the present specification, the equalizer circuit disposed in the inner bit line portion may be called "inner equalizing unit" whereas the equalizer circuit disposed in the outer bit line portion may be called "outer equalizing unit".

A PSA/NSA equalizer circuit 111 is made up of NMOS transistors Tr3 to Tr5, and its circuit structure is the same as that of the bit line equalizer circuit 107. Then, a PSA/NSA line equalization control signal BRSS is inputted to the gates of the transistors Tr3 to Tr5.

An equalization control signal EQ that is an output of an EQ generator circuit 108 is inputted to the PSA/NSA equalizer circuit 111 and the bit line equalizer circuit 107 through inverter gates 109 and 110. Also, a sense amplification active signal LE is inputted to an NMOS transistor Tr2 from the LE generator circuit 115, and /LE inverted by the inverter gates is inputted to a PMOS transistor Tr1.

When the equalization control signal EQ of low level is inputted to the inverter gates 109 and 110 from the EQ generator circuit 108, the PSA/NSA line equalization control signal BRSS of the high level of a step-up voltage Vpp is outputted from the inverter gate 109, and the bit line equalization control signal BRS of the high level of a step-up voltage Vpp or an inner step-down voltage Vcc is outputted from the inverter gate 110. When the bit line equalization control signal BRS of the high level is inputted to the bit line equalizer circuit 107, the NMOS transistor Tr6 is rendered conductive, and the bit lines BLX and BLZ are short-circuited. Simultaneously, the NMOS transistors Tr7 and Tr8 are rendered conductive, and the bit lines BLX and BLZ are charged to the equalization voltage Vpr, thereby initializing the bit lines. Likewise, when the PSA/NSA line equalization control signal BRSS of the high level is inputted to the PSA/NSA equalizer circuit 111, the sense amplification active lines PSA and NSA are initialized to the equalization voltage Vpr.

In the case where the memory block BLK1 is selected, charges (information) in the memory cell that is connected to any one word line selected from the word lines sw10, . . . are transmitted to the bit line BLLZ or BLLX. In this situation, because a voltage difference between the bit lines BLLZ and BLLX is slight, it is necessary to differentially amplify the voltage difference by means of the sense amplifier S/A. The sense amplifier is connected with the sense amplification active lines PSA and NSA that are connected to the inner step-down voltage Vcc and the ground voltage Vss through the transistors Tr1 and Tr2, respectively.

In order to differentially amplify and read the charges in the memory cell that is selected by any one word line selected from the word lines sw10, . . . by the sense amplifier S/A, the separation gate BTL is rendered conductive, and the separation gate BTR is rendered nonconductive. Then, the sense amplification active signal LE of the high level is outputted from the LE generator circuit 115, and the transistors Tr1 and Tr2 are rendered conductive. As a result, the inner step-down voltage Vcc is applied to the sense amplification active line PSA, and the ground voltage Vss is applied to the sense amplification active line NSA, thereby rendering the sense amplification S/A active.

Then, after the bit lines BLLZ and BLLX are restored, the sense amplification active signal LE of the low level is outputted from the LE generator circuit 115, and the transistors Tr1 and Tr2 are rendered nonconductive. Also, after the selected word line is rendered inactive, equalization between the bit lines BLZ and BLX and between the sense amplification active lines PSA and NSA is conducted by the low level of the equalization control signal EQ, and the preparation for reading charges in a subsequent memory cell is completed. In this event, it is necessary to keep the voltage between the bit lines BLRZ and BLRX in the unselected memory block BLK2 to the equalization voltage Vpr.

Figure 2:
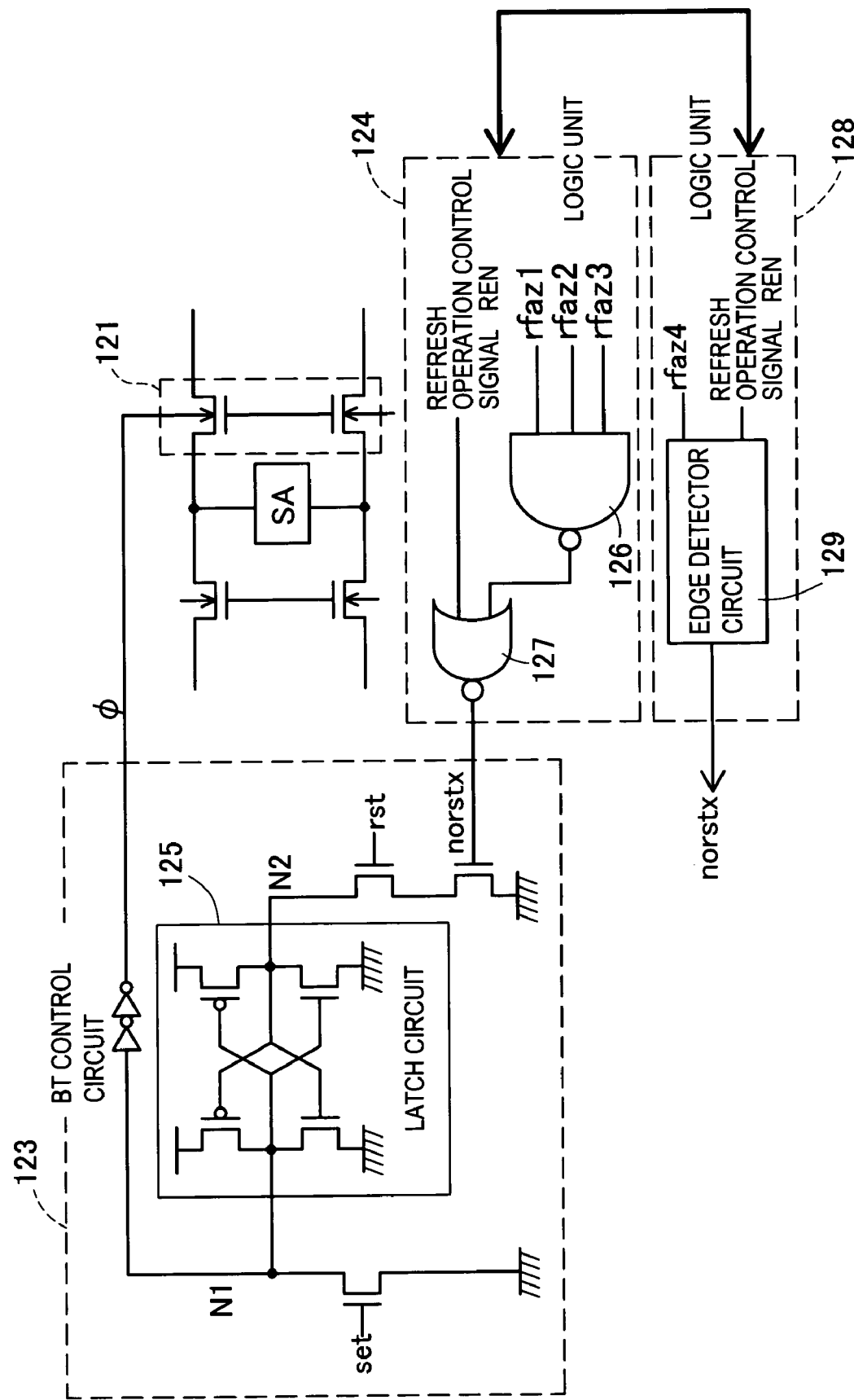
FIG. 2 is a control circuit diagram showing a separation gate of an unselected memory block in the first embodiment.
Figure 3:
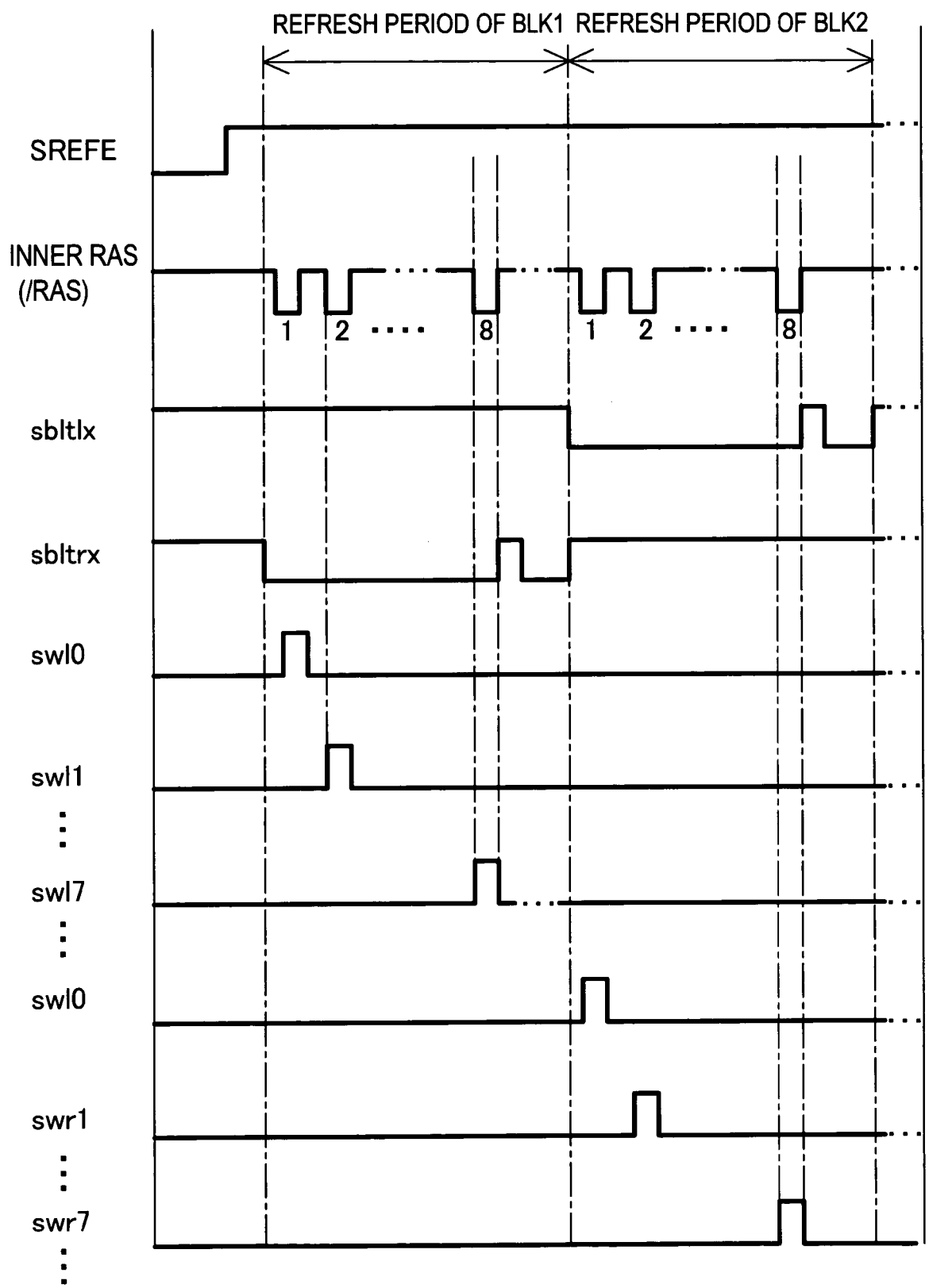
FIG. 3 is a timing chart representing the operation of the semiconductor memory device according to the first embodiment.
Figure 4:
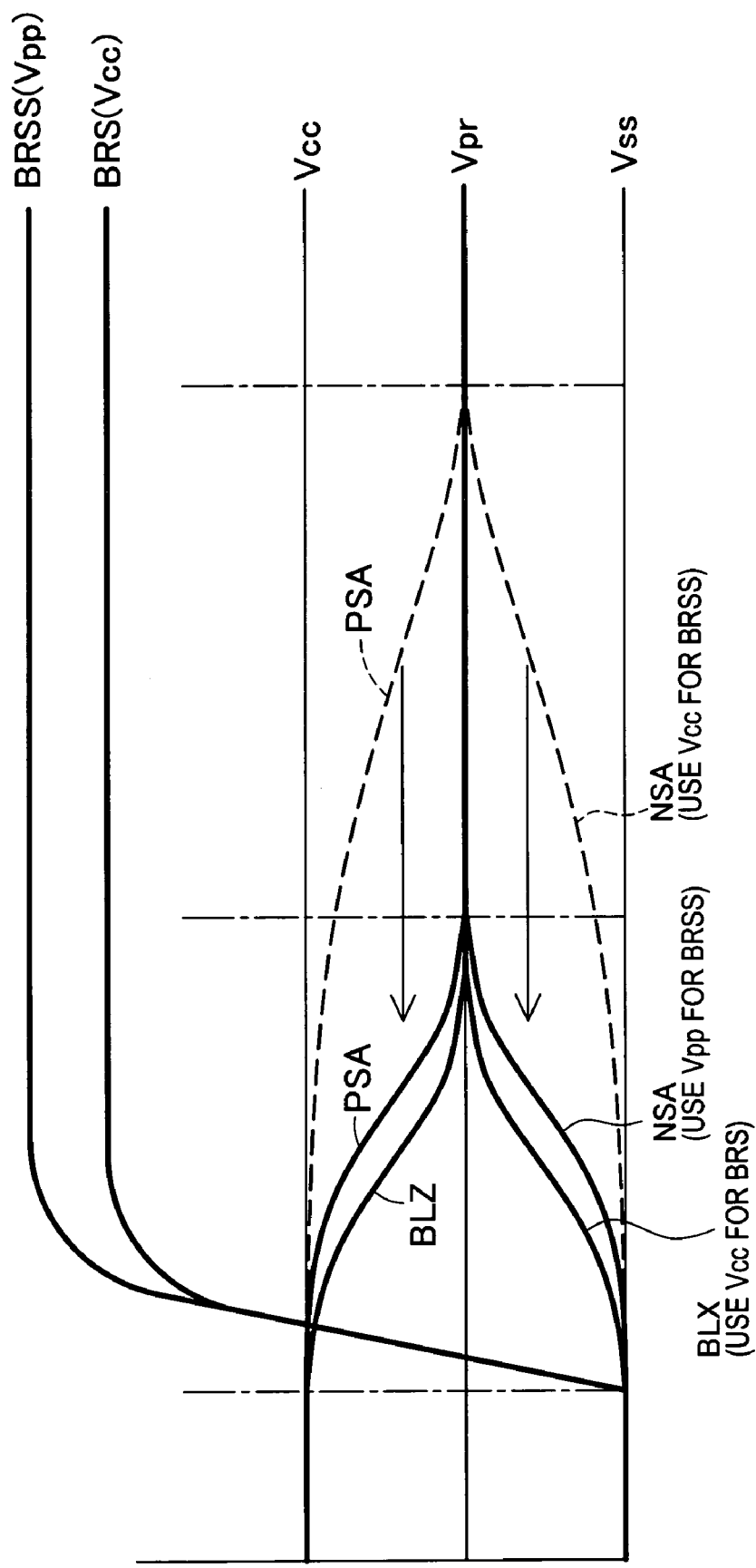
FIG. 4 is a graph showing a relationship of an equalizing time between bit lines and an equalizing time between sense amplification active lines according to the first embodiment.

FIG. 2 is a control circuit diagram showing a separation gate of an unselected memory block. FIG. 3 is a timing chart in the case where a control circuit of the separation gates in FIG. 2 is applied to the circuit in FIG. 1.

Referring to FIG. 1, when the block BLK1 is selected, and self refresh operation is conducted, the word lines sw10, . . . are sequentially activated while the bit lines BLLZ and BLLX are equalized. The n/k activation control signal φ is a control signal that activates the bit line separation gate BTR on the unselected block BLK 2 side by n times among k bit line equalizing operation (n≦k−1) and equalizes the bit lines BLRZ and BLRX. The word lines sw10, . . . of the block BLK1 are sequentially activated while repeating the activation and equalization of the word lines in such a manner that the activation of m-time word line, the equalization of the bit lines BLLZ and BLLX, the activation of (m+1)-time word line, the equalization of the bit lines BLLZ and BLLX, . . . are conducted in the stated order. In the above operation, the separation gate BTR is rendered conductive in a period of equalizing the bit lines immediately after the activation every time k/n word lines are activated. When the block BLK2 is selected and the refresh operation is conducted, the opposite operation of the above operation is conducted. That is, the separation gate BTL is rendered conductive in a period of equalizing the bit lines immediately after the activation every time k/n word lines in the block BLK2 are activated.

FIG. 2 shows a generation control circuit 123 of the n/k activation control signal φ. In the structural example of FIG. 2, there are provided a separation gate 121, a BT control circuit 123, and a logic unit 124. FIG. 2 shows a case of n=k/$2^3$, which is a structural example in which the separation gate 121 is rendered conductive every activation of 8 word lines. When the n/k activation control signal φ of low level is inputted to the bit line separation gate 121 from the BT control circuit 123, the separation gate 121 is rendered nonconductive. When the n/k activation control signal φ of high level is inputted to the bit line separation gate 121, the separation gate 121 is rendered conductive.

The BT control circuit 123 is provided with a latch circuit 125, and an NMOS transistor is connected between each of nodes N1 and N2 of the latch circuit 125 and the ground voltage Vss. The NMOS on the node N1 side inputs a set signal set, and the NMOS connected in series to the node N2 side inputs a reset signal rst and a control signal norstx. The signal φ becomes low level when the set signal set becomes high level, and the node N1 becomes the ground voltage Vss, that is, when the access operation is conducted in the selected memory block. The separation gate of the unselected block becomes nonconductive. On the other hand, the signal φ becomes high level when both of the reset signal rst and the control signal norstx become high level, and the node N2 becomes the ground voltage Vss. This is when the bit line equalizing operation is conducted in the selected memory block, and a timing that meets the control conditions in the logic unit 124 that will be described. In this event, the separation gate 121 of the unselected block becomes conductive.

Also, AND (logical multiplication) of the refresh addresses rfaz1 to rfaz3 of 3 bits of low-order is inverted and outputted from an NAND gate 126 of the logic unit 124. Also, OR (logical addition) of a refresh operation control signal REN and an output signal of the NAND gate 126 is inverted, and the control signal norstx is outputted from a NOR gate 127.

The refresh operation control signal REN is low level during the refresh operation. In this operating state, the control signal norstx of high level is outputted from the NOR gate 127 only when all of the refresh addresses rfaz1 to rfaz3 become high level. That is, the output of the logic unit 124 becomes high level only once among 8 times where the refresh address is transited.

The control signal norstx of the control unit 124 is inputted to the BT control circuit 123. The reset signal rst becomes high level every equalization period in the selected memory block. However, because the control signal norstx becomes high level only once among the equalization periods of 8 times as described above, the signal φ becomes high level only once among the equalizing operation of 8 times. As a result, the separation gate 121 is rendered conductive only once per the equalizing operation of 8 times.

Also, there is a case in which the logic unit 124 is replaced by a logic unit 128. The logic unit 128 is provided with an edge detector circuit 129 that inputs the refresh operation control signal REN and the refresh address rfaz4. The refresh operation control signal REN is low level during the refresh operation, and at this time, the edge detector circuit 129 becomes operative.

The refresh address rfaz4 is an address of 1-bit high order with respect to the refresh addresses rfaz1 to rfaz3, and the state transits from high level to low level or from low level to high level every logic combination of rfaz1 to rfaz3. In response to the transition of that state, the edge detector circuit 129 outputs a pulse wave of high level which is inputted to the BT control circuit 123 as the control signal norstx. When both of the reset signal rst and the control signal norstx become high level, and the node N2 becomes the ground voltage Vss, the n/k activation control signal φ becomes high level, and the separation gate 121 is rendered conductive. Accordingly, the separation gate 121 is rendered conductive only once per the equalizing operation of 8 times even in the case where the logic unit 128 is employed.

As described above, when the refresh address is used to control the separation gate, it is unnecessary to newly input or generate a dedicated timing signal.

FIG. 3 shows a timing chart. The self refresh operation is conducted according to the "high" level (active) of the self refresh enable signal SREFE. During a period where the block BLK1 is self-refreshed, the control signal sbltlx is kept at the "high" level, the separation gate BTL is rendered conductive, and the bit lines BLLZ and BLLX of the block BLK1 continue to be connected to the bit lines BLZ and BLX. During that period, the word lines sw10, . . . are sequentially activated and accessed to the memory cell in response to the "low" level transition of /RAS, and BLLZ and BLLX are restored. Also, the word lines sw10, . . . are sequentially inactivated in response to the "high" level transition of /RAS, and the bit lines BLLZ and BLLX are equalized.

Every time the activation of the 8 continuous word lines is completed, in a subsequent equalization period, the bit line separation gate control signal sbltrx becomes "high" level once, the separation BTR is rendered conductive, and the bit lines BLRZ and BLRX are connected to the bit lines BLZ and BLX. Then, the bit lines BLLZ and BLLX of the selected block BLK1 are equalized, and the bit lines BLRZ and BLRX of the selected block BLK2 are equalized.

Figure 11:
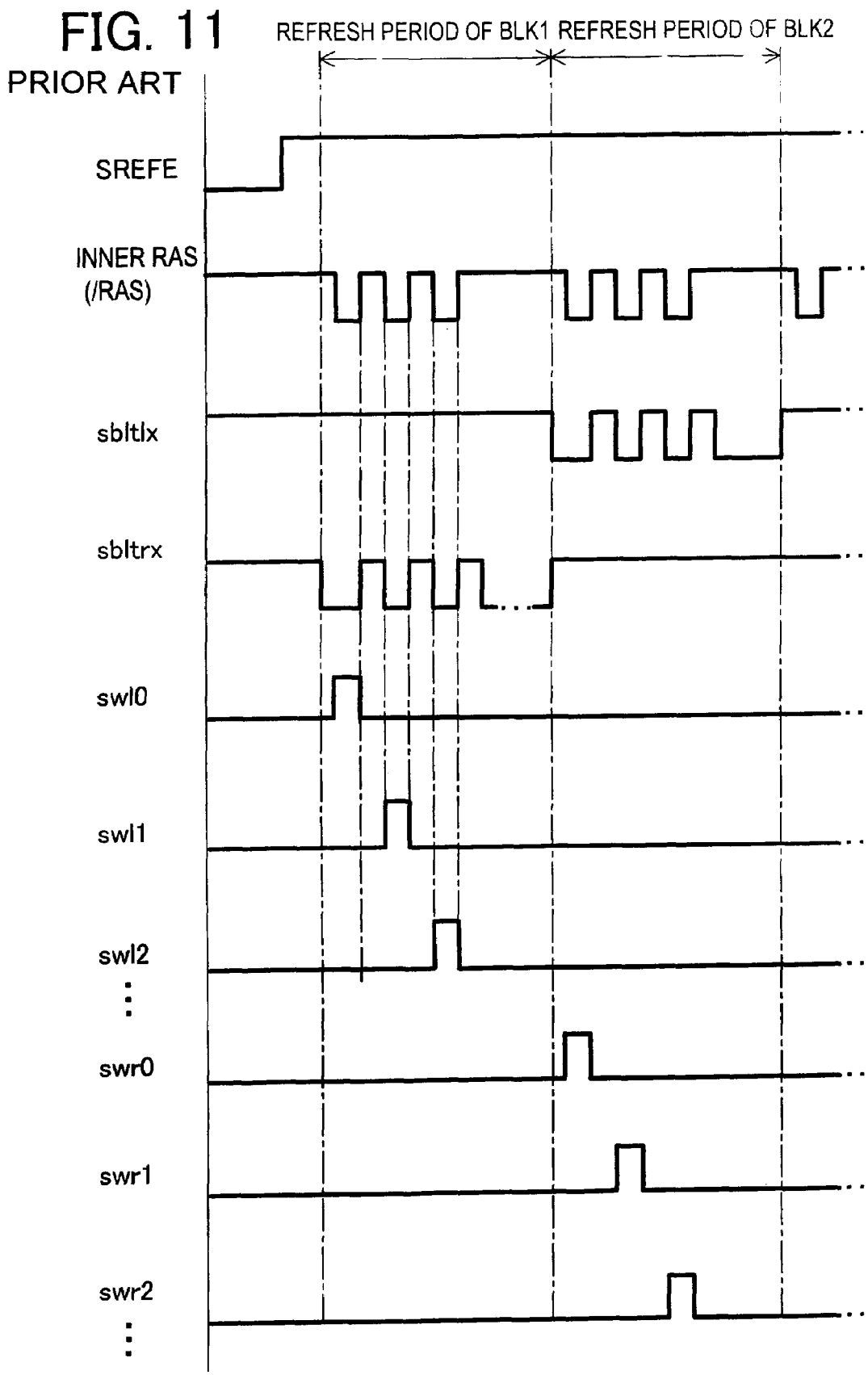
FIG. 11 is a timing chart representing the operation of the conventional semiconductor memory device.
Figure 12:
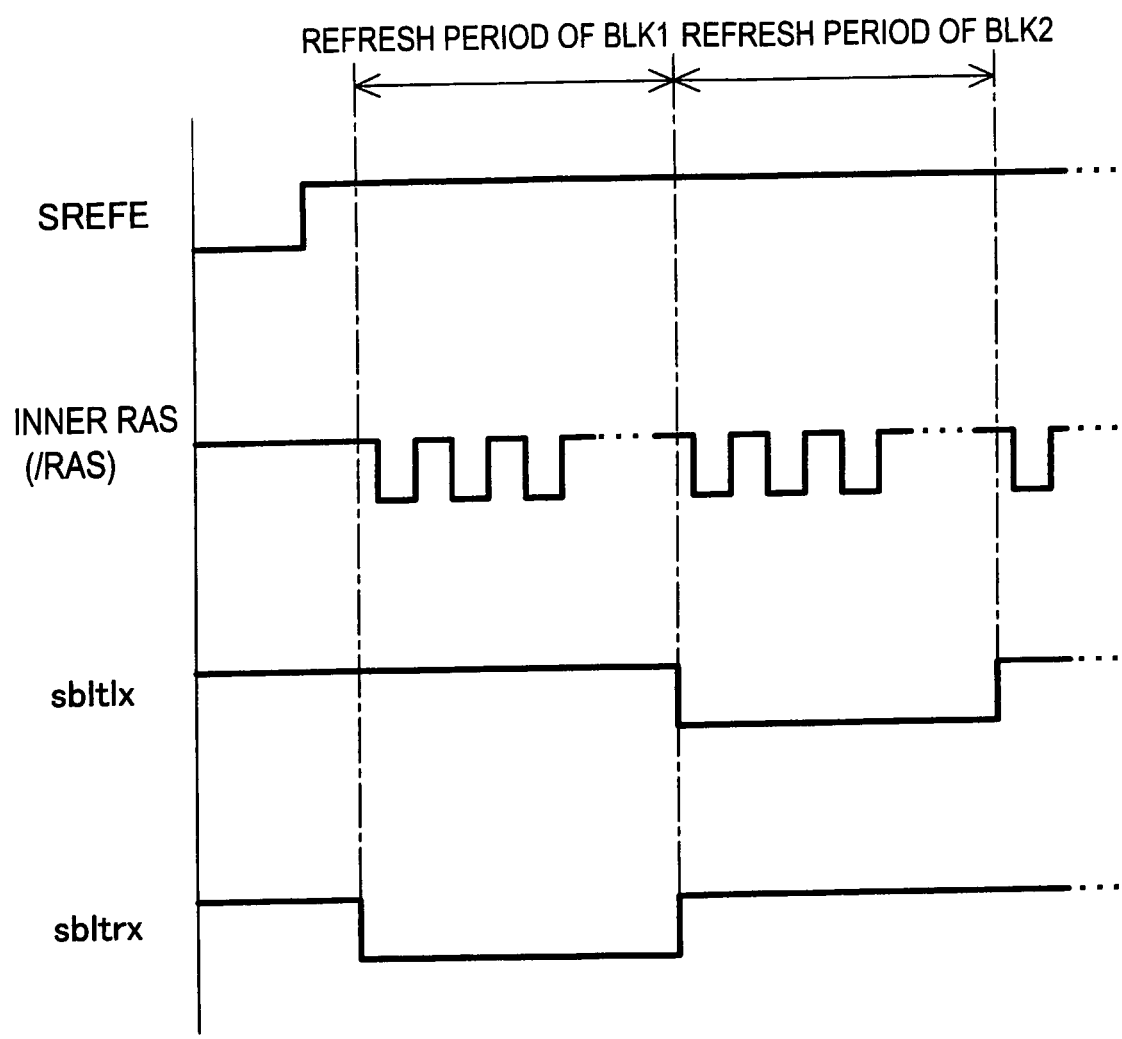
FIG. 12 is a second timing chart representing the operation of the conventional semiconductor memory device.
Figure 13:
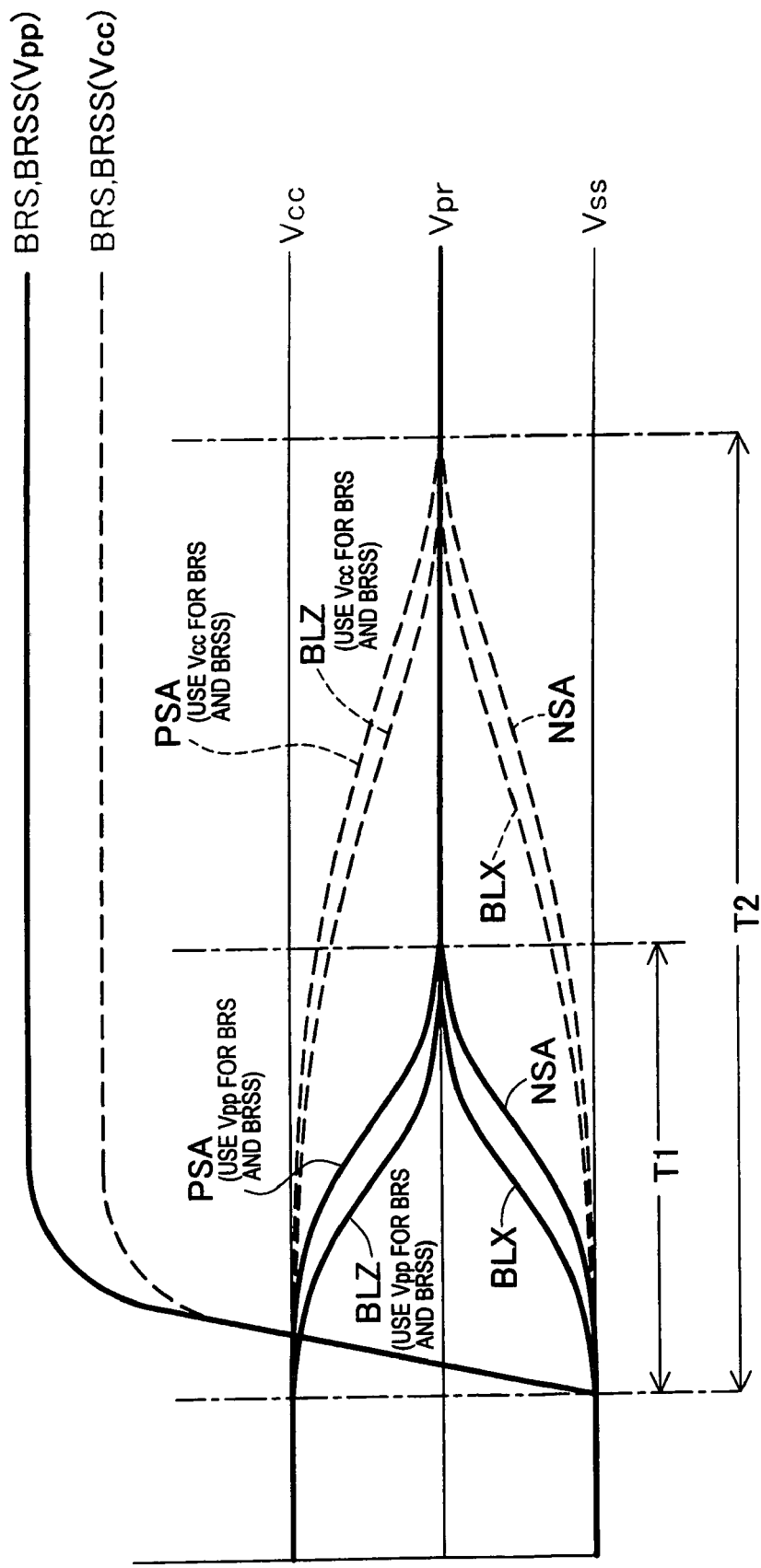
FIG. 13 is a graph showing a relationship of an equalizing time between bit lines and an equalizing time between sense amplification active lines according to the prior art.
Figure 14:
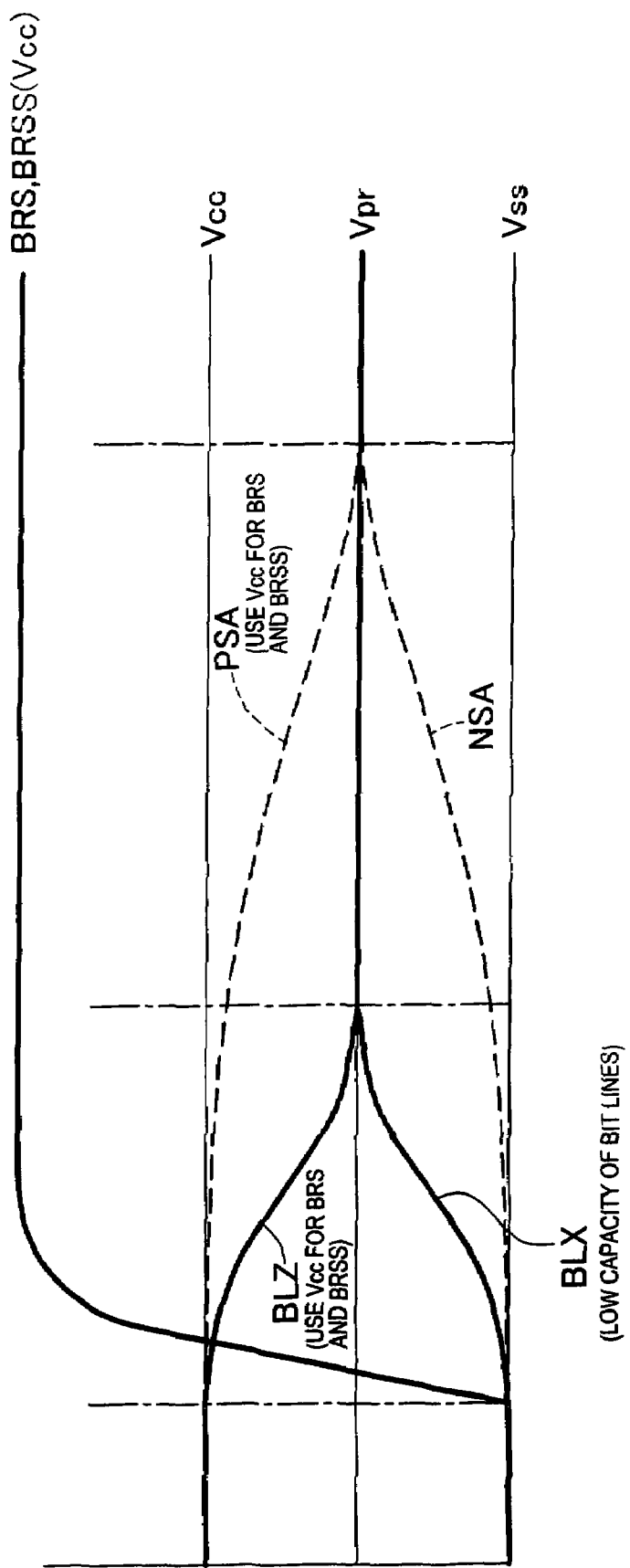
FIG. 14 is a second graph showing a relationship of an equalizing time between bit lines and an equalizing time between sense amplification active lines according to the prior art.

In the conventional art shown in FIG. 11, the control signal sbltrx of the separation gate on the unselected block BLK2 side becomes "high" level every equalization period of the selected block BLK1. As compared with the conventional art, it is understood that in the first embodiment shown in FIG. 3, the number of times of switching of the separation gate of the unselected block is reduced to ⅛, thereby reducing the charge and discharge current due to the switching operation.

Also, with the use of the separation gate control system according to the first embodiment shown in FIG. 3, even in the circuit structure providing no bit line equalizer circuit in both of the memory blocks BLK1 and BLK2, and providing the bit line equalizer circuit on the sense amplifier S/A side as shown in FIG. 1, a problem associated with floating of the bit line potential can be solved. Accordingly, it is possible to solve the problem associated with floating of the bit line potential due to the operation of the low current consumption while an increase in the chip area is suppressed.

It is needless to say that the activation frequency of the activation control signal φ of the separation gate is not limited to a value of ⅛ used in the first embodiment, and optimization is appropriately enabled according to the respective semiconductor memory devices.

Then, the address that is inputted to the NAND gate 126 of the logic unit 124 and the edge detector circuit 129 of the logic unit 128 in FIG. 2 is not limited to the refresh address, but an address during continuous access such as the burst operation can be used. In this situation, a signal that is inputted to the NOR gate 127 and the edge detector circuit 129 becomes a continuous access control signal or the like instead of the refresh operation control signal REN.

Then, in the first embodiment, a method of controlling the equalizer circuit will be described.

When a voltage of the control signal BRS that controls the bit line equalizer circuit 107 and a voltage of the control signal BRSS that controls the PSA/NSA equalizer circuit 111 are set according to the respective wiring capacities to be equalized, the equalization time lag between the bit lines BLZ and BLX and between the sense amplification active lines PSA and NSA is suppressed from occurring.

Referring to FIG. 1, the inverter gate 109 that outputs the equalization control signal BRSS of the sense amplification active line PSA/NSA has a voltage level conversion function, and the inner step-down voltage Vcc is converted into the step-up voltage Vpp and then supplied. On the other hand, in the inverter gate 110 that outputs the bit line equalization control signal BRS, the inner step-down voltage Vcc is applied without converting the voltage level.

Because the bit line lengths are shortened, and the lengths of the sense amplification active lines PSA and NSA are constant, the wiring capacity of the bit lines is reduced, and the wiring capacities of the sense amplification active lines become constant. For that reason, in the case where the equalization period of the bit lines and the sense amplification active lines does not change before and after the bit line length is altered, the driving performance of the transistors used in the PSA/NSA equalizer circuit 111 must be enhanced as compared with the driving performance of the transistors used in the bit line equalizer circuit 107.

In the first embodiment, the step-up voltage Vpp is used for the PSA/NSA line equalization control signal BRSS, and the inner step-down voltage Vcc is used for the bit line equalization control signal BRS. As a result, as indicated by a solid line in FIG. 4, it is possible to reduce a time lag between the equalization time between the bit lines BLZ and BLX and the equalization time between the sense amplification active lines PSA and NSA as a first advantage. The equalizations between BLZ and BLX and between PSA and NSA are conducted at the same timing, thereby making it possible to prevent the abnormal current of short-circuiting within the sense amplifier S/A which is attributable to the equalization and to reduce the current consumption. As a second advantage, When not the step-up voltage Vpp but the inner step-down voltage Vcc is used for the control signal BRS, the driving current consumption of the transistors in the equalizer circuit due to the step-up voltage Vpp can be reduced without increasing the equalization time between BLZ and BLX and between PSA and NSA. In addition, the current consumption of the step-up circuit (not shown) can also be reduced.

In the case where the relationship in the equalization time lag between BLZ and BLX and between PSA and NSA is reversed because the wiring capacity of the bit lines increases more than the wiring capacity of the sense amplification active line, a voltage used for the control signal BRS changes from the inner step-down voltage Vcc to the step-up voltage Vpp, and a voltage used for the control signal BRSS changes from the step-up voltage Vpp to the inner step-down voltage Vcc, thereby obtaining the same effect in a reduction of the equalization time lag and a reduction of the current consumption.

Also, a value of the supply voltage for driving the equalizer circuits 107 and 111 is not limited to the step-up voltage Vpp and the inner step-down voltage Vcc which are used in this embodiment. For example, the equalizer circuits 107 and 111 can be driven by using an arbitrary appropriate combination of the outer voltage Vdd, the step-up voltage Vpp and the inner step-down voltage Vcc according to the respective semiconductor memory devices.

In addition, when the method of controlling the separation gate used in the first embodiment and the method of controlling the equalizer circuit are implemented in combination, a lower current consumption can be performed while an increase in the memory cell area and a reduction in the accessing speed are suppressed.

Figure 5:
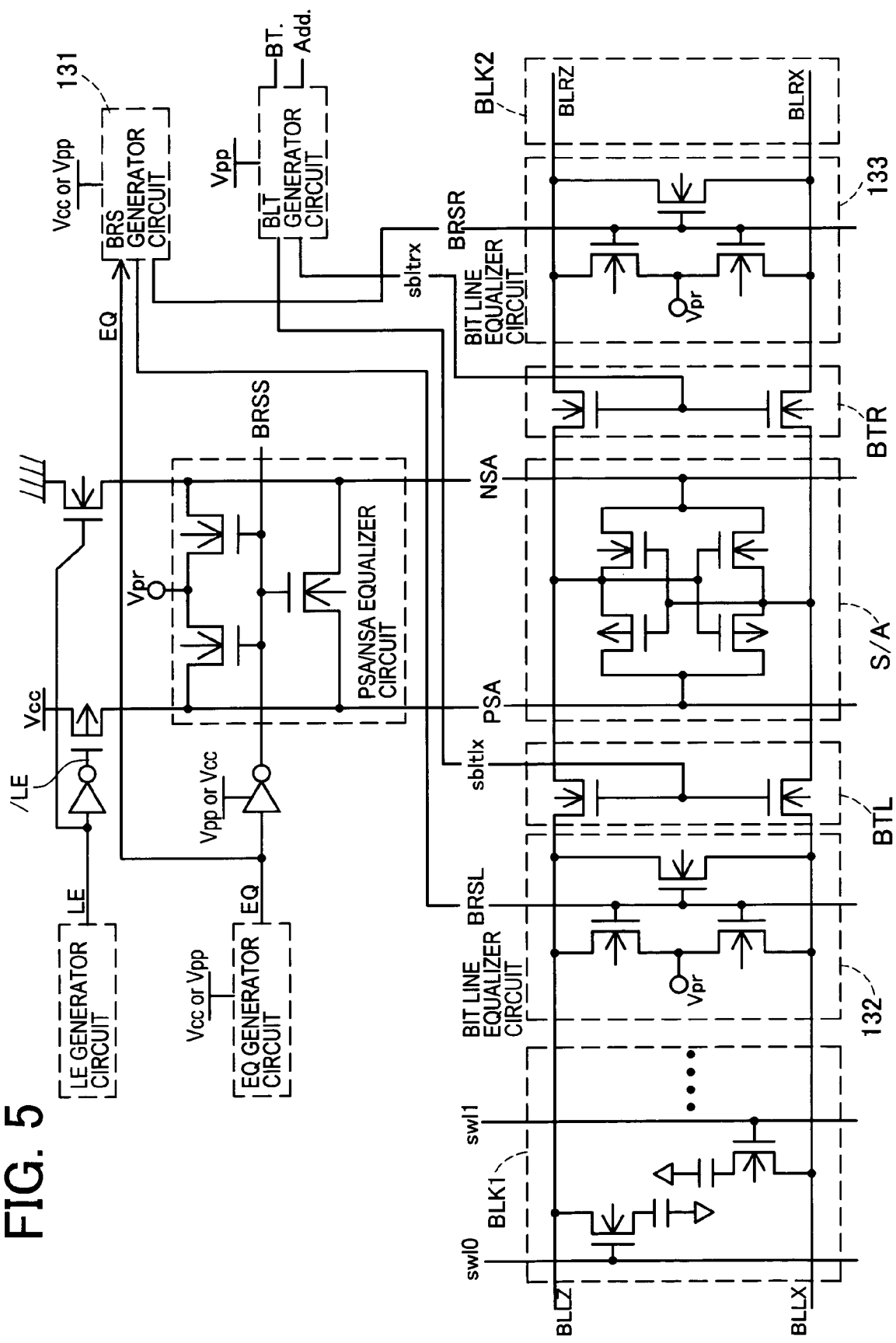
FIG. 5 is a diagram showing a part of a shared sense amplifier system in a semiconductor memory device according to a second embodiment.

In the second embodiment of FIG. 5, the bit line equalizer circuit 107 according to the first embodiment shown in FIG. 1 is replaced by two bit line equalizer circuits 132 and 133, which are connected between the bit lines BLLZ and BLLX and between the bit lines BLRZ and BLRX, respectively. The BRS generator circuit 131 inputs the equalization control signal EQ and outputs the bit line equalization control signals BRSL and BRSR that have been converted into voltage, which are inputted to the bit line equalizer circuits 132 and 133, respectively. The structure and operation of the bit line equalizer circuits 132 and 133 are identical with those of the equalizer circuit 107 (FIG. 1). Even in the case where the bit line separation gate of the unselected memory block is kept in the nonconductive state, the circuit structure can solve a problem such as the destroy of data due to floating of the bit line potential.

Similarly, in the circuit structure shown in FIG. 5, it is possible to obtain the same advantages as those in the first embodiment by using the method of controlling the equalizer circuit of the first embodiment. That is, in the case where the bit line lengths of the bit lines BLLZ, BLLX, BLRZ and BLRX are set to be shorter than those of the conventional bit lines, the step-up voltage Vpp may be used for the PSA/NSA line equalization control signal BRSS, and the inner step-down voltage Vcc may be used for the bit line equalization control signals BRSL and BRSR.

With the above structure, the time lag in the equalization time therebetween is reduced, thereby making it possible to prevent the abnormal current of short-circuiting within the sense amplifier S/A which is attributable to the equalization with the result that the current consumption can be reduced. In addition, the inner step-down voltage Vcc is used for the equalization control signals BRSL and BRSR, as a result of which the driving current consumption of the transistors in the equalizer circuit due to the step-up voltage Vpp can be reduced without any increase in the equalization time of the bit lines and the sense amplification active lines. Moreover, the current consumption of the step-up circuit (not shown) can be also reduced. Also, in the case where the wiring capacity of the bit lines is larger than the wiring capacity of the sense amplification active lines, a voltage used for the control signals BRSL and BRSR changes from the inner step-down voltage Vcc to the step-up voltage Vpp, and a voltage used for the PSA/NSA line equalization control signal BRSS changes from the step-up voltage Vpp to the inner step-down voltage Vcc, thereby obtaining the same effect.

Figure 6:
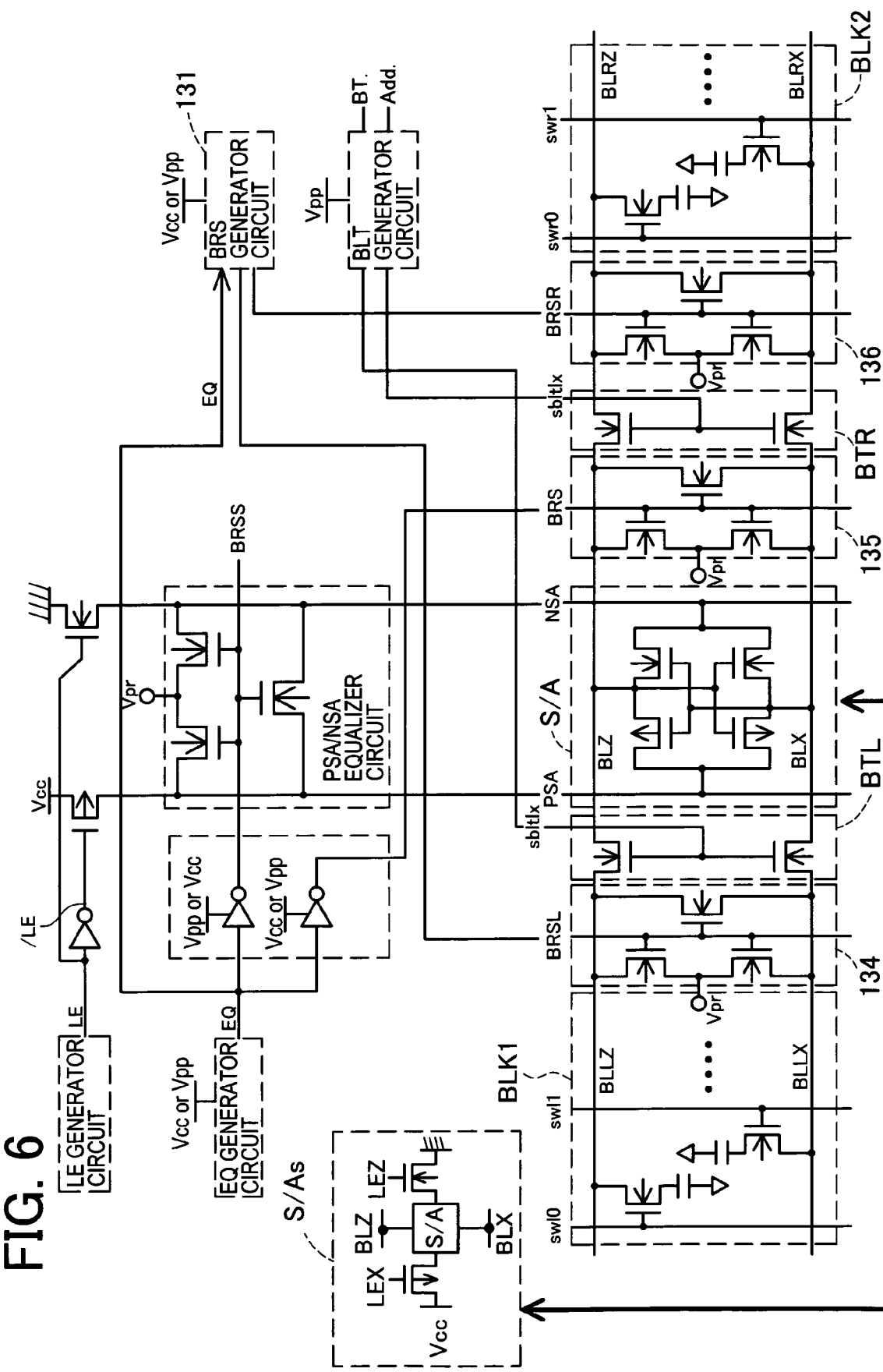
FIG. 6 is a diagram showing a part of a shared sense amplifier system in a semiconductor memory device according to a third embodiment.

In the third embodiment of FIG. 6, the bit line equalizer circuits 132 and 133 according to the second embodiment shown in FIG. 5 is replaced by three bit line equalizer circuits 134, 135 and 136, which are connected between the bit lines BLLZ and BLLX, between the bit lines BLZ and BLX, and between the bit lines BLRZ and BLRX, respectively. Also, the bit line equalizer circuits 134, 135 and 136 input the bit line equalization control signals BRSL, BRS and BRSR, respectively. The structure and operation of the bit line equalizer circuits 134, 135 and 136 are identical with those of the equalizer circuit 107 (FIG. 1). Even in the case where the bit line separation gate of the unselected memory block is kept in the nonconductive state, the circuit structure can solve a problem such as destruction of data due to floating of the bit line potential.

Similarly, in the circuit structure shown in FIG. 6, it is possible to obtain the same advantages as those in the first embodiment by using the method of controlling the equalizer circuit of the first embodiment. That is, in the case where the bit line lengths of the bit lines BLLZ, BLLX, BLRZ and BLRX are set to be shorter than those of the conventional bit lines, the step-up voltage Vpp may be used for the control signal BRSS, and the inner step-down voltage Vcc may be used for the control signals BRSL and BRSR.

With the above structure, the time lag in the equalization time therebetween is reduced, thereby making it possible to prevent the abnormal current of short-circuiting within the sense amplifier S/A which is attributable to the equalization with the result that the current consumption can be reduced. In addition, the driving current consumption of the transistors in the equalizer circuit due to the step-up voltage Vpp and the current consumption of the step-up circuit can be reduced without any increase in the equalization time of the bit lines and the sense amplification active lines. Also, in the case where the wiring capacity of the bit lines is larger than the wiring capacity of the sense amplification active lines, the step-up voltage Vpp is used for the bit line equalization control signals BRS, BRSL and BRSR, and the inner step-down voltage Vcc is used for the control signal BRSS, thereby obtaining the same effect.

Figure 7:
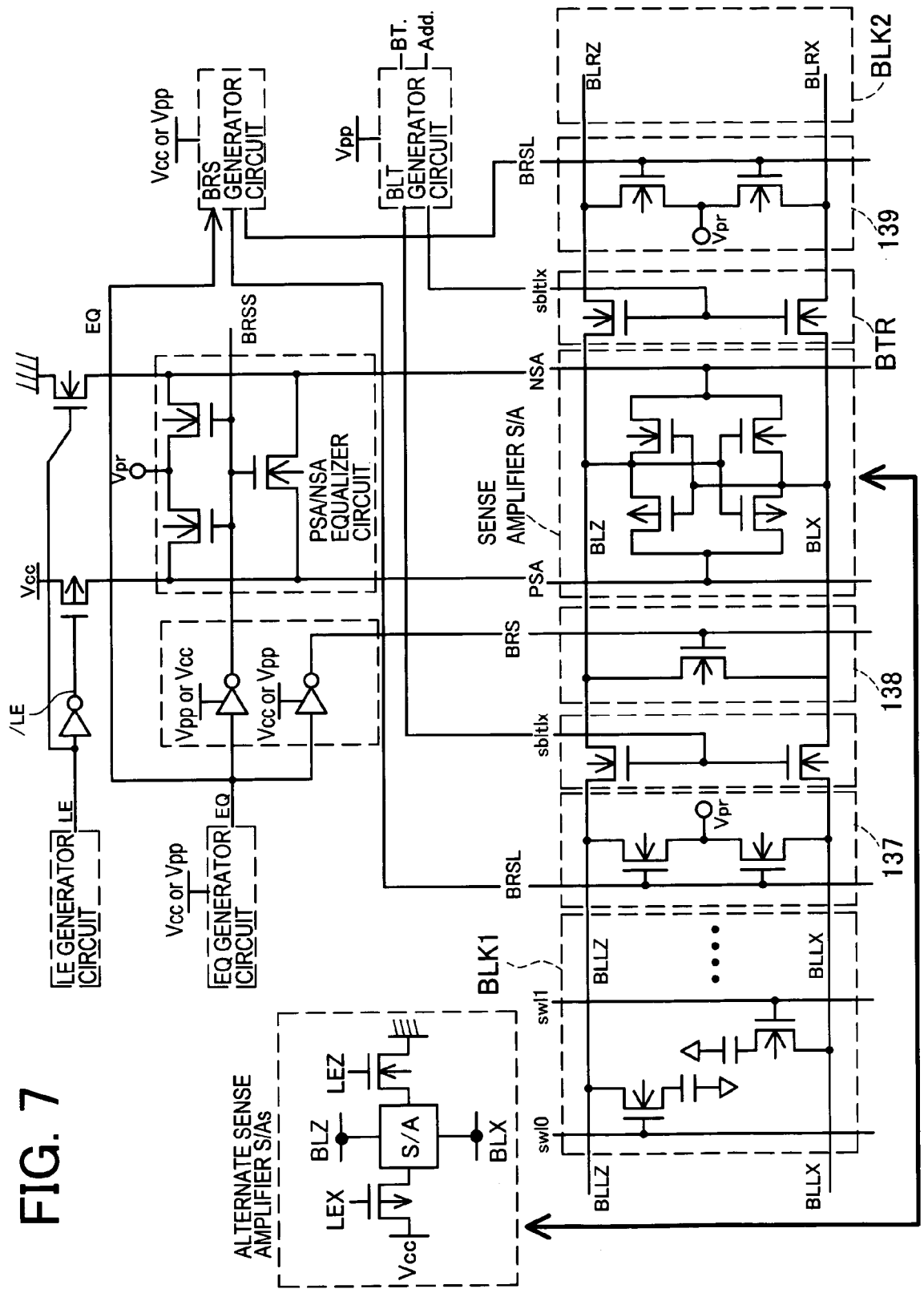
FIG. 7 is a diagram showing a part of a shared sense amplifier system in a semiconductor memory device according to a fourth embodiment.

In the fourth embodiment of FIG. 7, the bit line equalizer circuits according to the third embodiment shown in FIG. 6 is replaced by three bit line equalizer circuits 137, 138 and 139, which are connected between the bit lines BLLZ and BLLX, between the bit lines BLZ and BLX, and between the bit lines BLRZ and BLRX, respectively. Also, the bit line equalizer circuits 137, 138 and 139 are connected to the bit line equalization control signals BRSL, BRS and BRSR, respectively. Each of the bit line equalizer circuits 137 and 139 is made up of two NMOS transistors and has a function of applying the equalization voltage Vpr to the bit lines. Also, the equalizer circuit 138 is made up of one NMOS transistor and has a function of short-circuiting the bit lines BLZ and BLX.

In the circuit structure, even in the case where the bit line separation gate of the unselected memory block is kept in the nonconductive state, there is no fear of destruction of data due to floating of the bit line potential. In addition, it is possible to reduce the number of transistor elements used for the bit line equalization as compared with that in the second and third embodiments (FIGS. 5 and 6) with the result that the chip area can be reduced. That is, 6 elements are required in the bit line equalizer circuits 132 and 133 in the second embodiment (FIG. 5), and 9 elements are required in the bit line equalizer circuits 134, 135 and 136 in the third embodiment (FIG. 6). On the contrary, the circuit can be structured by 5 elements in total in the bit line equalizer circuits 137, 138 and 139 in FIG. 7. Similarly, in the circuit shown in FIG. 7, the same effect as that in the first embodiment can be obtained by using the method of controlling the equalizer circuit of the first embodiment.

Figure 8:
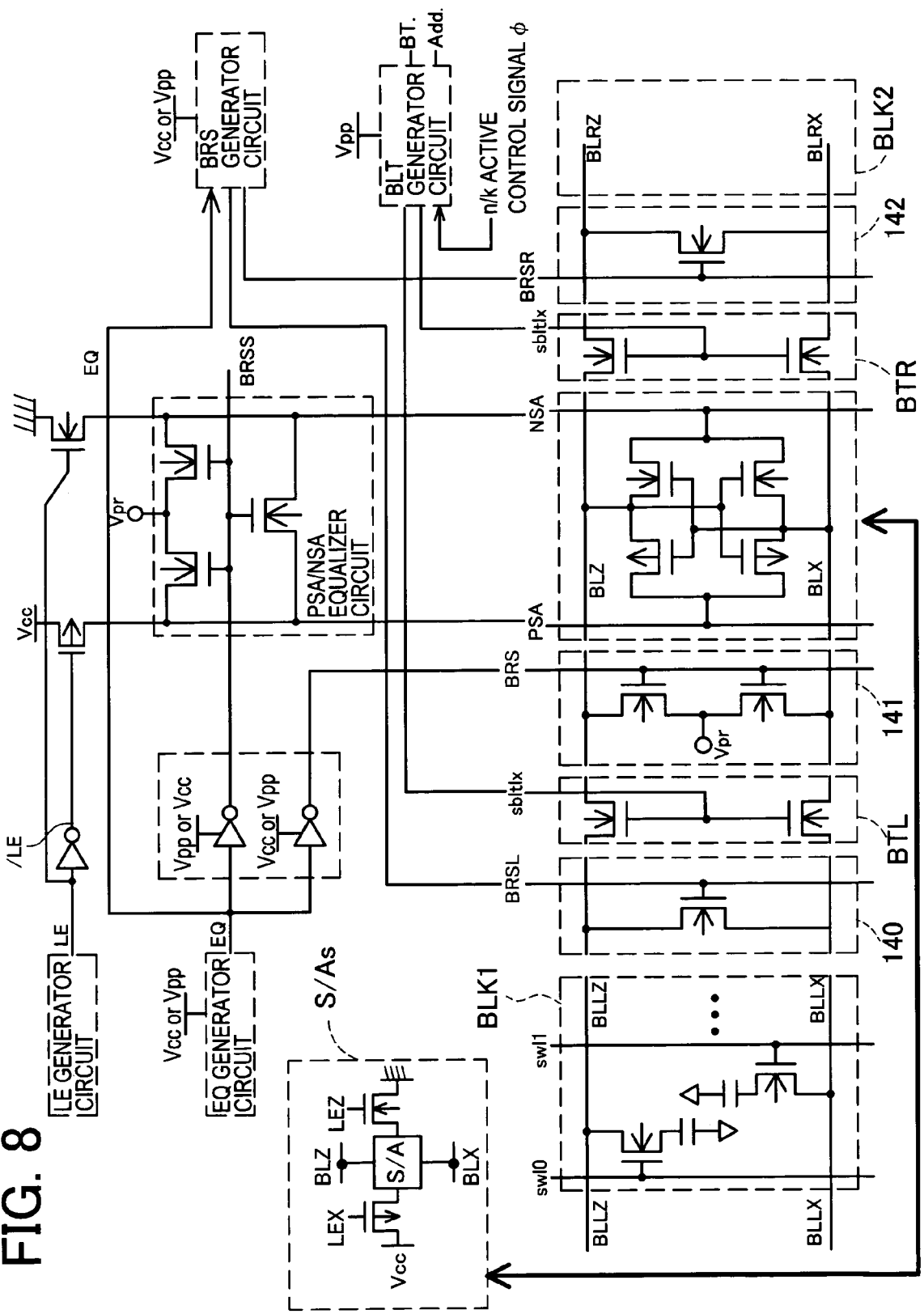
FIG. 8 is a diagram showing a part of a shared sense amplifier system in a semiconductor memory device according to a fifth embodiment.

In the fifth embodiment of FIG. 8, the bit line equalizer circuits 137, 138 and 139 according to the fourth embodiment shown in FIG. 7 is replaced by three bit line equalizer circuits 140, 141 and 142, which are connected between the bit lines BLLZ and BLLX, between the bit lines BLZ and BLX, and between the bit lines BLRZ and BLRX, respectively. Also, the bit line equalizer circuits 140, 141 and 142 input the bit line equalization control signals BRSL, BRS and BRSR. The equalizer circuit 141 is identical in the circuit structure with the equalizer circuits 137 and 139 shown in FIG. 7, and the equalizer circuits 140 and 142 are identical in the circuit structure with the equalizer circuit 138 shown in FIG. 7.

In the circuit structure, in the equalizer circuits 140 to 142, the circuit can be structured by 4 transistor elements in total. On the other hand, in the equalizer circuits 137 to 139 according to the fourth embodiment shown in FIG. 7, 5 elements in total are required. Accordingly, the chip area is further reduced in the fifth embodiment as compared with the equalizer circuit of the fourth embodiment.

Similarly, in the circuit according to the fifth embodiment, the same advantages as those in the first embodiment can be obtained by using the method of controlling the equalizer circuit of the first embodiment. Also, as in the first embodiment (FIG. 1), in order to prevent the floating of the bit lines on the unselected block side, it is preferable to further use the method of controlling the separation gate in combination.

In the sixth embodiment, a description will be given of a case in which the sense amplifier S/A is replaced by an alternate sense amplifier S/As in the third to fifth embodiments (FIGS. 6 to 8). When a low level signal and a high level signal are inputted to the sense amplification control signals LEX and LEZ, respectively, the inner step-down voltage Vcc and the ground voltage Vss are applied to the alternate sense amplifier S/As, and the alternate sense amplifier S/As becomes active. Also, a time lag may occur between a time at which the paired outer bit lines BLLZ-BLLX and BLRZ-BLRX within the selected memory block have been equalized and a time at which the paired inner bit lines BLZ-BLX which are connected with the alternate sense amplifier have been equalized due to a difference in the wiring capacity. In this case, the natural operation performance of the semiconductor memory device cannot be realized by rate-controlling to the longer equalizing time.

Figure 9:
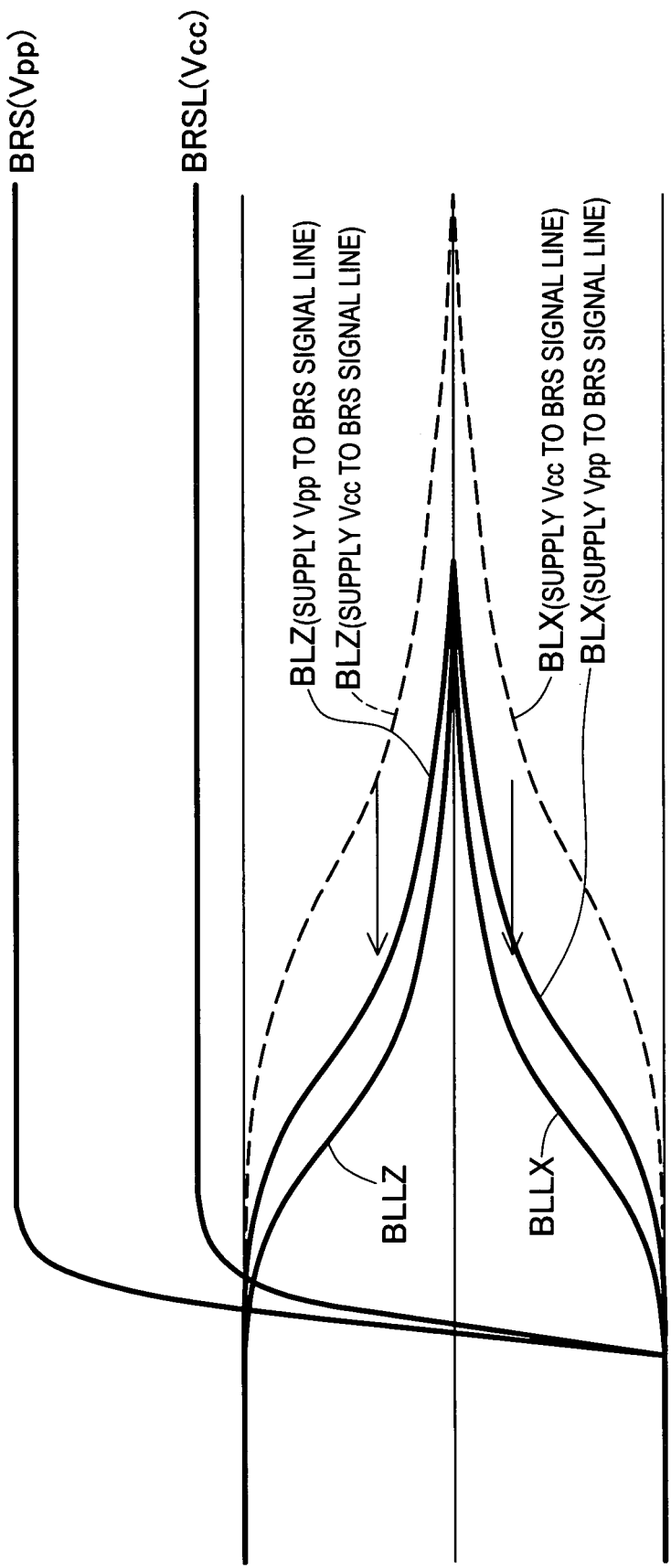
FIG. 9 is a graph showing a relationship of an equalizing time between inner bit lines and an equalizing time between outer bit lines according to a sixth embodiment.
Figure 10:
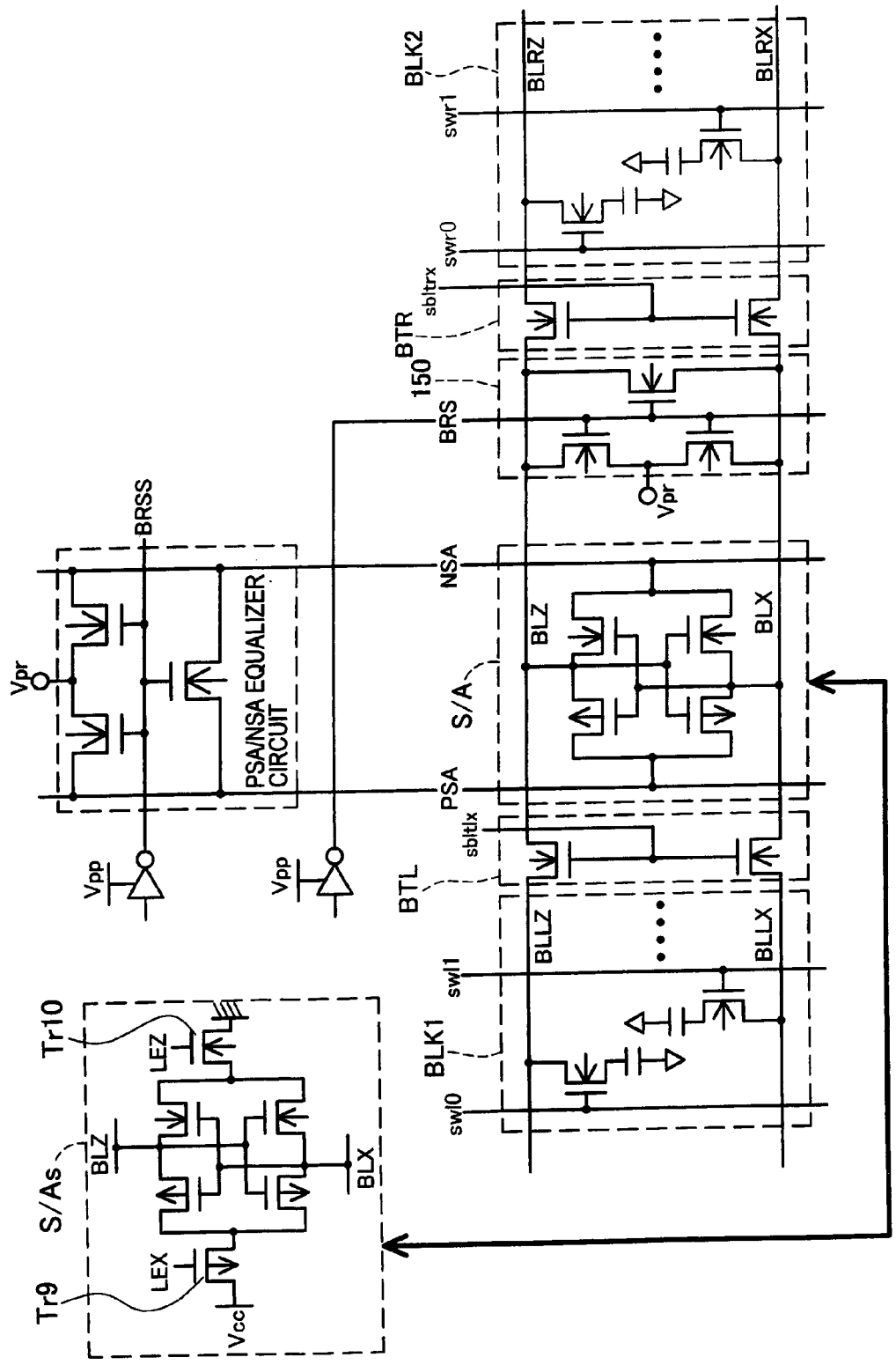
FIG. 10 is a diagram showing a part of a conventional shared sense amplifier system.

Let us consider a case in which the wiring capacity of the bit lines within the memory block is smaller than the wiring capacity of the bit lines BLZ and BLX that are connected with the alternate sense amplifier S/As with the structure where the line lengths of the bit lines BLLZ and BLLX within the memory block BLK1 and the bit lines BLRZ and BLRX within the block BLK2 are shorter than the conventional line lengths. In this case, assuming that the inner step-down voltage Vcc is used for both of the control signal line BRSL of the bit line equalizer circuit 134 and the control signal line BRS of the equalizer circuit 135, when the equalization time between the bit lines BLLZ and BLLX is compared with the equalization time between the bit lines BLZ and BLX, the equalization time between BLLZ and BLLX becomes shorter as shown in FIG. 9.

Under the above circumstances, when control is made by different voltages such that the inner step-down voltage Vcc is used for the control signal BRSL of the equalizer circuit 134, and the step-up voltage Vpp is used for the control signal BRS of the equalizer circuit 135, the time lag in the equalization between both of the bit lines is reduced. That is, in FIG. 9, the time lag in the equalization between both of the bit lines is reduced by shortening the equalization time between BLZ and BLX (reduced from a dotted line portion to a solid line in FIG. 9), to thereby reduce the time lag in the equalization between both of the bit lines. When the memory block BLK2 is selected, the same advantage is obtained by using the inner step-down voltage Vcc for the control signal BRSR and the step-up voltage Vpp for the control signal BRS.

In the case where the relationship in the equalization time lag between BLZ and BLX and between BLLZ and BLLX is reversed because the wiring capacity of the bit lines BLLZ and BLLX within the memory block increases more than the wiring capacity of the bit lines BLZ and BLX that are connected with the alternate sense amplifier S/As, a voltage used for the control signal BRS changes from the step-up voltage Vpp to the inner step-down voltage Vcc, and a voltage used for the control signal BRSL changes from the inner step-down voltage Vcc to the step-up voltage Vpp to reduce the equalization time lag, thereby obtaining the same effect. Also, a value of the supply voltage for driving the equalizer circuits is not limited to the step-up voltage Vpp and the inner step-down voltage Vcc which are used in this embodiment. For example, the equalizer circuits can be driven by using an arbitrary appropriate combination of the outer voltage Vdd, the step-up voltage Vpp and the inner step-down voltage Vcc according to the respective semiconductor memory devices.

Likewise, in the fourth embodiment (FIG. 7) and the fifth embodiment (FIG. 8), the equalizer circuit using the alternate sense amplifier S/As can be used in the control method shown in the sixth embodiment.

The present invention is not limited to the above embodiments, but various improvements and modifications can be conducted within the subject matter of the present invention. It is needless to say that the control method of the bit line separation gate, the control method of the bit line and sense amplification active line equalizer circuits, and the arrangement and circuit structure of the equalizer circuit can be appropriately combined together.

According to the present invention, the control method of the bit line separation gate, the control method of the equalizer circuits, and the arrangement and circuit structure of the equalizer circuit are appropriately combined together, as a result of which there can be provided the semiconductor memory device that can conduct operation with the low current consumption, and the control method of the semiconductor memory device while the operating speed in the normal accessing operation and the chip area are maintained.

What is claimed is:

1. A semiconductor memory device having first and second memory blocks from which stored information is read in bit lines according to a selected word line, and a sense amplifier shared by each of first and second bit lines within the first and second memory blocks, the semiconductor memory device comprising:
    a first separation gate that controls the connection and separation of the first bit line and the sense amplifier; and
    an equalizing unit that equalizes the second bit line,
    wherein when the second memory block is accessed, the first separation gate connects the first bit line and the sense amplifier in an active period of the equalizing unit after the word line is selected in a predetermined number of times which is (k−1) times or less among k times (where k is an integer) of continuous word line selections when the second memory block is accessed.

2. The semiconductor memory device according to claim 1, further comprising a second separation gate that connects the second bit line and the sense amplifier according to a period of accessing to the second memory block,
    wherein the equalizing unit is disposed on at least one of the second memory block side and the sense amplifier side with respect to the second separation gate.

3. The semiconductor memory device according to claim 1,
    wherein the first separation gate is activated when an address that identifies k (where k is an integer) word lines that are continuously selected is a predetermined logic combination in the second memory block.

4. A semiconductor memory device according to claim 1,
    wherein the first separation gate is activated when an address of higher order by one bit than an address that identifies k word lines that are continuously selected in the second memory block transits a logic state.

5. A semiconductor memory device according to claim 1,
    wherein the access operation of the second memory block is refresh operation, and an address that selects k (where k is an integer) continuous word lines is a refresh address.

6. The semiconductor memory device according to claim 1,
    wherein the access operation of the second memory block is continuous access operation including changeover of the word lines, and
    wherein an address that selects k continuous word lines is a row address or a part thereof.

7. A semiconductor memory device having a sense amplification activating unit that applies a supply voltage to two power supply lines that are commonly connected to a plurality of sense amplifiers provided for each of the bit lines when stored information read to the bit lines is amplified by the plurality of sense amplifiers, the semiconductor memory device comprising:
    a first equalizing unit that equalizes the power supply lines by activation through a first voltage; and
    a second equalizing unit that equalizes the bit lines by activation through a second voltage,
    wherein when the supply power voltage to the power supply lines is shut off by the sense amplification activating unit, and the first and second equalizing units are actuated, the first voltage is set to be higher voltage level than that of the second voltage in the case where the wiring capacity component of the bit lines becomes smaller than the wiring capacity component of the power supply lines, and the first voltage is set to be lower voltage level than that of the second voltage in the case where the wiring capacity component of the bit lines becomes larger than the wiring capacity component of the power supply lines.

8. The semiconductor memory device according to claim 7,
    further comprising a separation gate that separates the bit lines into an inner bit line portion that is connected to the sense amplifier, and an outer bit line portion from which stored information is read,
    wherein the second equalizing unit is disposed as any one of an inner equalizing unit disposed in the inner bit line portion and an outer equalizing unit disposed in the outer bit line portion.

9. The semiconductor memory device according to claim 8,
    wherein two bit lines as one pair are differentially amplified by the sense amplifiers, the inner and outer equalizing units include a short-circuiting portion that short-circuits the paired inner and outer bit line portions, and at least any one of the inner and outer equalizing portions includes a bias portion(s) that biases the inner or outer bit line portion to the equalization voltage.

10. The semiconductor memory device according to claim 7,
    wherein the first equalizing unit includes at least one MOS transistor that connects the power supply lines to each other, and the MOS transistor is rendered conductive and activated by applying the first voltage to a gate terminal.

11. The semiconductor memory device according to claim 7,
    wherein the second equalizing unit includes at least any one of at least one MOS transistor that connects between the bit lines and the supply source of the equalization voltage and at least one MOS transistor that connects between the bit lines when the two bit lines are structured as one pair, and the MOS transistor is rendered conductive and activated by applying the second voltage to the gate terminal.

12. A semiconductor memory device that amplifies the stored information read to the bit lines by a plurality of sense amplifiers disposed in each of the bit lines having sense amplification activating units that control the application of the supply voltage in each of the sense amplifications, the semiconductor memory device comprising:

a separation gate that separates the bit lines into an inner bit line portion that is connected to the sense amplifiers and an outer bit liner portion from which the stored information is read;

an inner equalizing unit that equalizes the inner bit line portion while activating the inner bit line portion by a first voltage; and an outer equalizing unit that equalizes the outer bit line portion while activating the outer bit line portion by a second voltage that is different from the first voltage.

13. The semiconductor memory device according to claim 12, wherein when the supply power voltage is shut off by the sense amplification activating unit, and the inner and outer equalizing units are actuated in the equalizing operation, the first voltage is set to be higher voltage level than that of the second voltage in the case where the wiring capacity component of the outer bit line portion becomes smaller than the wiring capacity component of the inner bit line portion, and the first voltage is set to be lower voltage level than that of the second voltage in the case where the wiring capacity component of the outer bit line portion becomes larger than the wiring capacity component of the inner bit line portion.

14. The semiconductor memory device according to claim 12, wherein the inner equalizing unit and the outer equalizing unit include at least any one of at least one MOS transistor that connects between the inner bit line and the supply source of the equalization voltage and the outer bit line and the supply voltage of the equalization voltage, and at least one MOS transistor that connects between the bit lines when the inner bit lines and the outlet bit lines are structured as one pair respectively, and the MOS transistor is rendered conductive and activated by applying the second voltage to the gate terminal.

15. A method of controlling a semiconductor memory device in which a sense amplifier is shared by each of first and second bit lines within first and second memory blocks from which stored information is read in the bit lines according to a selected word line, the semiconductor memory device, comprising:

a selected block accessing step of continuously repeating restoring operation subsequent to a word line selection and subsequent equalizing operation in the second bit line; and an unselected block equalizing step of connecting the first bit line and the sense amplifier in the equalizing operation of a predetermined number of times which is (k−1) times or less among k times (where k is an integer) of the selected block accessing step.

16. The method of controlling a semiconductor memory device according to claim 15, wherein the selected block accessing step comprises a connecting step of connecting the second bit line and the sense amplifier, and wherein the equalizing operation of the second bit line starts at least one of the second memory block side and the sense amplifier side.

17. The method of controlling a semiconductor memory device according to claim 15, wherein the connection of the first bit line and the sense amplifier in the unselected block equalizing step is conducted according to a predetermined logic combination of an address that identifies k (where k is an integer) continuous word line selections in the selected block accessing step.

18. The method of controlling a semiconductor memory device according to claim 15, wherein the connection of the first bit line and the sense amplifier in the unselected block equalizing step is conducted when an address of higher order by one bit than an address that identifies k (where k is an integer) continuous word line selections in the selected block accessing step transits a logic state.

19. A method of controlling a semiconductor memory device according to claim 15, wherein the access operation in the selected block accessing step is refresh operation, and wherein an address that selects k (where k is an integer) continuous word lines is a refresh address.

20. The method of controlling a semiconductor memory device according to claim 15, wherein the access operation of the second memory block is continuous access operation including changeover of the word lines, and wherein an address that selects k (where k is an integer) continuous word lines is a row address or a part thereof.

21. A method of controlling a semiconductor memory device in which a supply voltage is applied to two power supply lines that are commonly connected to a plurality of sense amplifiers provided for each of the bit lines when stored information read to the bit lines is amplified by the plurality of sense amplifiers, the method comprising:

in equalizing operation, a voltage supply shut-off step of shutting off the supply power voltage to the power supply lines; and an equalizing step of equalizing the power supply lines while controlling the power supply lines by a first voltage and equalizing the bit lines while controlling the bit lines by a second voltage that is different from the first voltage, wherein the equalizing operation comprises an equalizing step of equalizing the power supply lines and the bit lines with the equal period of time in such a manner that in the case where the wiring capacity component of the bit lines becomes smaller than the wiring capacity component of the power supply lines, the power supply lines are controlled by a first voltage so as to be equalized, and the bit lines are controlled by a second voltage of a lower voltage level than that of the first voltage so as to be equalized, and in the case where the wiring capacity component of the bit lines becomes larger than the wiring capacity component of the power supply lines, the power supply lines are controlled by the first voltage so as to be equalized, and the bit lines are controlled by the second voltage of a higher voltage level than that of the first voltage so as to be equalized.

22. The method of controlling a semiconductor memory device according to claim 21, wherein the semiconductor memory device includes a separation gate that separates the bit lines into an inner bit line portion that is connected to the sense amplifier and an outer bit line portion from which stored information is read, the method further comprising:

a step of bringing the separation gate into conduction; and a step of causing the equalizing step to start at least one of the inner bit line portion and the outer bit line portion after the step of bringing the separation gate into conduction.

23. The method of controlling a semiconductor memory device according to at least any one of claim 22, wherein two bit lines as one pair are differentially amplified by the sense amplifies, the equalizing step comprises a short-circuiting step of short-circuiting the paired inner and outer bit line portions, and a bias step of biasing at least any one of the inner and outer bit line portions to the equalization voltage.

24. A method of controlling a semiconductor memory device that amplifies stored information that is read to bit lines after a supply voltage is applied to each of plural sense amplifiers disposed in each of the bit lines in which the bit lines include an outer bit line portion from which the stored information is read and an inner bit line portion that is connected to the sense amplifiers, the method comprising:

an equalizing step of equalizing the inner bit line portion while controlling the inner bit line portion by a first voltage and equalizing the outer bit line portion while controlling the outer bit line portion by a second voltage different from the first voltage.

25. The method of controlling a semiconductor memory device according to claim 24, wherein the equalizing operation comprises an equalizing step of equalizing the inner bit line portion while controlling the inner bit line portion by a first voltage, and equalizing the outer bit line portion while controlling the outer bit line portion by a second voltage of a lower voltage level than the first voltage in the case where the wiring capacity component of the outer bit line portion becomes smaller than the wiring capacity component of the inner bit line portion, and equalizing the inner bit line portion while controlling the inner bit line portion by the first voltage, and equalizing the outer bit line portion while controlling the outer bit line portion by a second voltage of a higher voltage level than the first voltage in the case where the wiring capacity component of the outer bit line portion becomes larger than the wiring capacity component of the inner bit line portion.

* * * * *